(12) United States Patent
Kluth et al.

(10) Patent No.: US 7,504,326 B2
(45) Date of Patent: Mar. 17, 2009

(54) USE OF SCANNING THEME IMPLANTERS AND ANNEALERS FOR SELECTIVE IMPLANTATION AND ANNEALING

(75) Inventors: George Jonathan Kluth, Hopewell Junction, NY (US); Douglas James Bonser, Hopewell Junction, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 331 days.

(21) Appl. No.: 11/420,819

(22) Filed: May 30, 2006

(65) Prior Publication Data
US 2007/0281450 A1   Dec. 6, 2007

(51) Int. Cl.
  *H01L 21/04* (2006.01)
(52) U.S. Cl. ............... 438/510; 438/512; 438/514; 438/524; 438/689; 257/E21.347
(58) Field of Classification Search ............... None
See application file for complete search history.

(56) References Cited

U.S. PATENT DOCUMENTS

2005/0051271 A1* 3/2005 Collins et al. .......... 156/345.31
2005/0170572 A1* 8/2005 Hongo et al. ............... 438/166
2008/0067433 A1* 3/2008 Weiguo et al. ......... 250/492.21

* cited by examiner

*Primary Examiner*—N Drew Richards
*Assistant Examiner*—Kyoung Lee
(74) *Attorney, Agent, or Firm*—Winstead PC

(57) ABSTRACT

A method and system for integrated circuit (IC) processing combines an ion implantation tool and a laser anneal tool in a single unit with a shared precision X-Y scanner. A semiconductor wafer is loaded onto a the X-Y table of the scanner. Data defining the desired ion implantation is used to first customize circuit areas on the semiconductor wafer by gating ON and OFF the ion beam while semiconductor wafer is scanned. Any inadvertent ion beam interruptions are noted by storing the locations of the interruptions. The wafer is then reprocessed to correct faults caused by the interruptions. The laser anneal tool positions the laser beam over the semiconductor wafer it is then scanned while gating the laser beam ON and OFF to custom anneal the wafer devices. Again, any inadvertent laser beam interruptions are detected and the locations of the interruptions are stored for reprocessing to correct faults.

4 Claims, 4 Drawing Sheets

USE OF SCANNING THEME IMPLANTERS AND ANNEALERS FOR SELECTIVE IMPLANTATION AND ANNEALING

TECHNICAL FIELD

The present invention relates to semiconductor processes and in particular to the implantation and annealing steps associated with such processes.

BACKGROUND INFORMATION

In semiconductor device fabrication, the various processing steps fall into four general categories: deposition, removal, patterning, and modification of electrical properties. Deposition is any process that grows, coats, or otherwise transfers a material onto the wafer. Available technologies consist of physical vapor deposition (PVD), chemical vapor deposition (CVD), electrochemical deposition (ECD), molecular beam epitaxy (MBE) and more recently, atomic layer deposition (ALD) among others. Removal processes are any that remove material from the wafer either in bulk or selective form and consist primarily of etch processes, both wet etching and dry etching such as reactive ion etch (RIE). Chemical-mechanical planarization (CMP) is also a removal process used between levels. Patterning covers the series of processes that shape or alter the existing shape of the deposited materials and is generally referred to as lithography. For example, in conventional lithography, the wafer is coated with a chemical called a "photoresist." The photoresist is exposed by a "stepper," a machine that focuses, aligns, and moves the mask, exposing select portions of the wafer to short wavelength light. The unexposed regions are washed away by a developer solution. After etching or other processing, the remaining photoresist may be removed by plasma ashing.

Modification of electrical properties has historically consisted of doping transistor sources and drains, originally by diffusion furnaces and later by ion implantation. These doping processes are followed by furnace anneal, or in advanced devices, by rapid thermal anneal (RTA), which serve to activate the implanted dopants. Modification of electrical properties now also extends to reduction of dielectric constant in low-k insulating materials via exposure to ultraviolet light in UV processing (UVP).

Many modern chips have eight or more levels produced in over 300 sequenced processing steps. The raw wafer is engineered by at minimum, growth of an ultra-pure, defect-free silicon surface through epitaxy. In the most advanced logic devices, prior to silicon epitaxy, tricks are performed to improve the performance of the transistors to be built. One method involves introducing a "straining step" wherein a silicon variant such as "silicon-germanium" (SiGe) is deposited. Once the epitaxial silicon is deposited, the crystal lattice becomes stretched somewhat, resulting in improved electronic mobility. Another method, called "silicon on insulator" technology involves the insertion of an insulating layer between the raw silicon wafer and the thin layer of subsequent silicon epitaxy. This method results in the creation of more idealized transistors with minimized parasitic effects.

Front end surface engineering is followed by: growth of the gate dielectric, traditionally silicon dioxide (SiO2), patterning of the gate, patterning of the source and drain regions, and subsequent implantation or diffusion of dopants to obtain the desired complimentary electrical properties. In memory devices, storage cells (conventionally capacitors) are also fabricated at this time, either into the silicon surface or stacked above the transistor.

Once the various semiconductor devices have been created, they must be interconnected to form the desired electrical circuits. This process involves creating metal interconnecting wires that are isolated by insulating materials often referred to in the industry as dielectrics. The insulating material was traditionally a form of $SiO_2$ or a silicate glass, but recently new low dielectric constant materials are being used. These dielectrics presently have dielectric constants around 2.7, although materials with constants as low as 2.2 are being offered to chipmakers.

Historically, the metal wires consisted of aluminum. In this approach to wiring often called "subtractive aluminum," blanket films of aluminum are deposited first, patterned, and then etched, leaving isolated wires. Dielectric material is then deposited over the exposed wires. The various metal layers are interconnected by etching holes, called "vias," in the insulating material and depositing tungsten in them with a chemical vapor deposition (CVD) technique. This approach is still used in the fabrication of many memory chips such as dynamic random access memory (DRAM) as the number of interconnect levels is small, currently no more than four.

More recently, as the number of interconnect levels for logic has substantially increased due to the large number of transistors that are now interconnected in a modern microprocessor, the timing delay in the wiring has become significant prompting a change in wiring material from aluminum to copper and from the aforementioned silicon dioxides to newer low-K materials. This performance enhancement also comes at a reduced cost via "damascene" processing that eliminates processing steps. In damascene processing, in contrast to subtractive aluminum technology, the dielectric material is deposited first as a blanket film and is patterned and etched leaving holes or trenches. In "single damascene" processing, copper is then deposited in the holes or trenches surrounded by a thin barrier film resulting in filled vias or wire "lines" respectively. In "dual damascene" technology, both the trench and via are fabricated before the deposition of copper resulting in formation of both the via and line simultaneously, further reducing the number of processing steps. The thin barrier film, called Copper Barrier Seed (CBS), is a necessary evil to prevent copper diffusion into the dielectric. As the presence of excessive barrier film competes with the available copper wire cross section, formation of the thinnest yet continuous barrier represents one of the greatest ongoing challenges in copper processing.

Current doping processes require photoresist or some other type of blocking layer to place dopant in only the desired regions of an IC wafer. Patterning of the photoresist or other type of blocking layer typically requires lithography steps before implantation and removal steps after implantation. In addition to adding considerable time to the overall process flow, lithography steps are expensive and the required removal steps may affect the overall process integration, for example, by removing finite amounts of field oxide. If the need for a photoresist was eliminated, then it would be possible to reduce the implantation and anneal steps into one step performed in a single tool.

Therefore, there is a need for a method for ion implantation and annealing that reduces the process steps so they may be implemented on a single tool thereby reducing the number of different process steps.

SUMMARY

The present invention configures a single tool that incorporates an ion implanter and a laser annealing device. These two devices are linked to a scanner capable of receiving wafers from the process stream. The wafers use the same type of scanner employed in photolithographic tools to expose photoresist. The scanner has the ability to receive and locate the wafer precisely relative to positions of the ion implanter and the laser annealing device. The data set defining the implantation locations and levels are sent to the controller for the combination tool. The scanner is used to move the wafer relative to the ion implantation beam while the data is used to turn ON and OFF the beam to pattern the implantation for the device types and characteristics. Any interruptions in the implantation process are stored and used to retrace those areas to ensure proper implantation for the wafer. After implantation, the laser anneal device is positioned over the wafer and the same scanner is used to scan the laser beam over the wafer. Data stored in the controller is used to turn ON and OFF the laser beam to allow custom annealing of areas of the wafer. Since no photoresist is involved in the implantation step, the laser anneal may be done within the same tool immediately following implantation.

According to the system and method disclosed here within, a single tool is used to perform the steps of ion implantation and laser annealing without the use of photoresist thereby saving equipment and reducing the number of process steps.

The foregoing has outlined rather broadly the features and technical advantages of the present invention in order that the detailed description of the invention that follows may be better understood. Additional features and advantages of the invention will be described hereinafter which form the subject of the claims of the invention

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
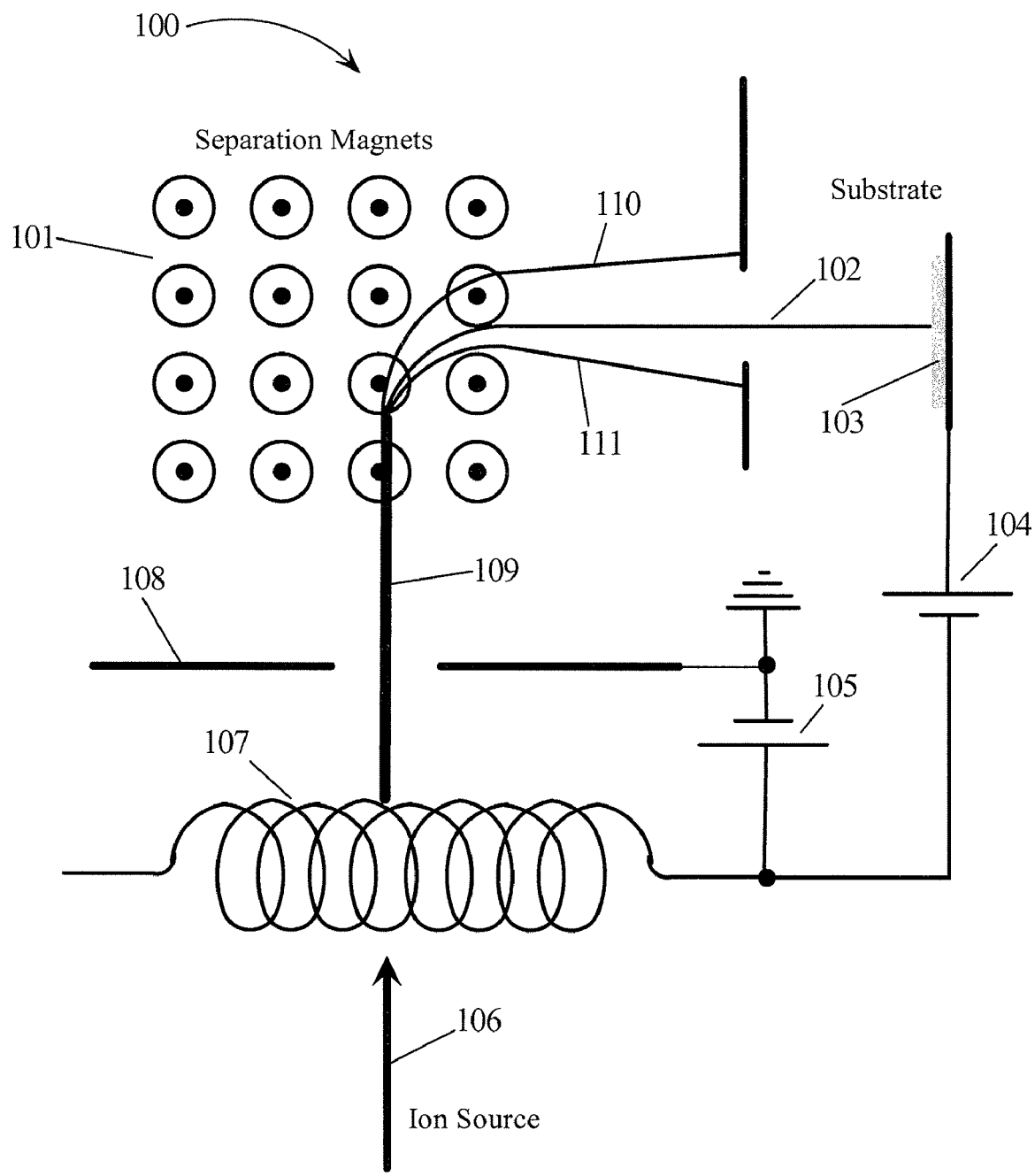
FIG. 1 is a schematic diagram of an exemplary ion implanter suitable for use with embodiments of the present invention.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 illustrates elements of an ion implantation tool 100. An exemplary substrate 103 is positioned on an scanning device used to move the substrate 103 in a single plane with high precision. A bias voltage 104 may be applied to the substrate 103 to enhance the implantation process. A source of ions 106 are charged in unit 107 by voltage 105. The charged ions 109 are directed through an aperture 108. Separation magnets 101 are used to separate the ion stream 109 into a beam 102 of desired ions to be implanted and rejected beams 110 and 111 having ions not desired for implantation. The desired ions are attracted to the charged substrate 103. The potential differences between 104 and 105 serve to accelerate the ion beam 109 to increase its effectiveness. Ion beam 102 contains the specific ions that are desired in selected areas on substrate 103. The ion beam may be gated ON and OFF as the substrate 103 is scanned to implant desired areas.

Figure 2:
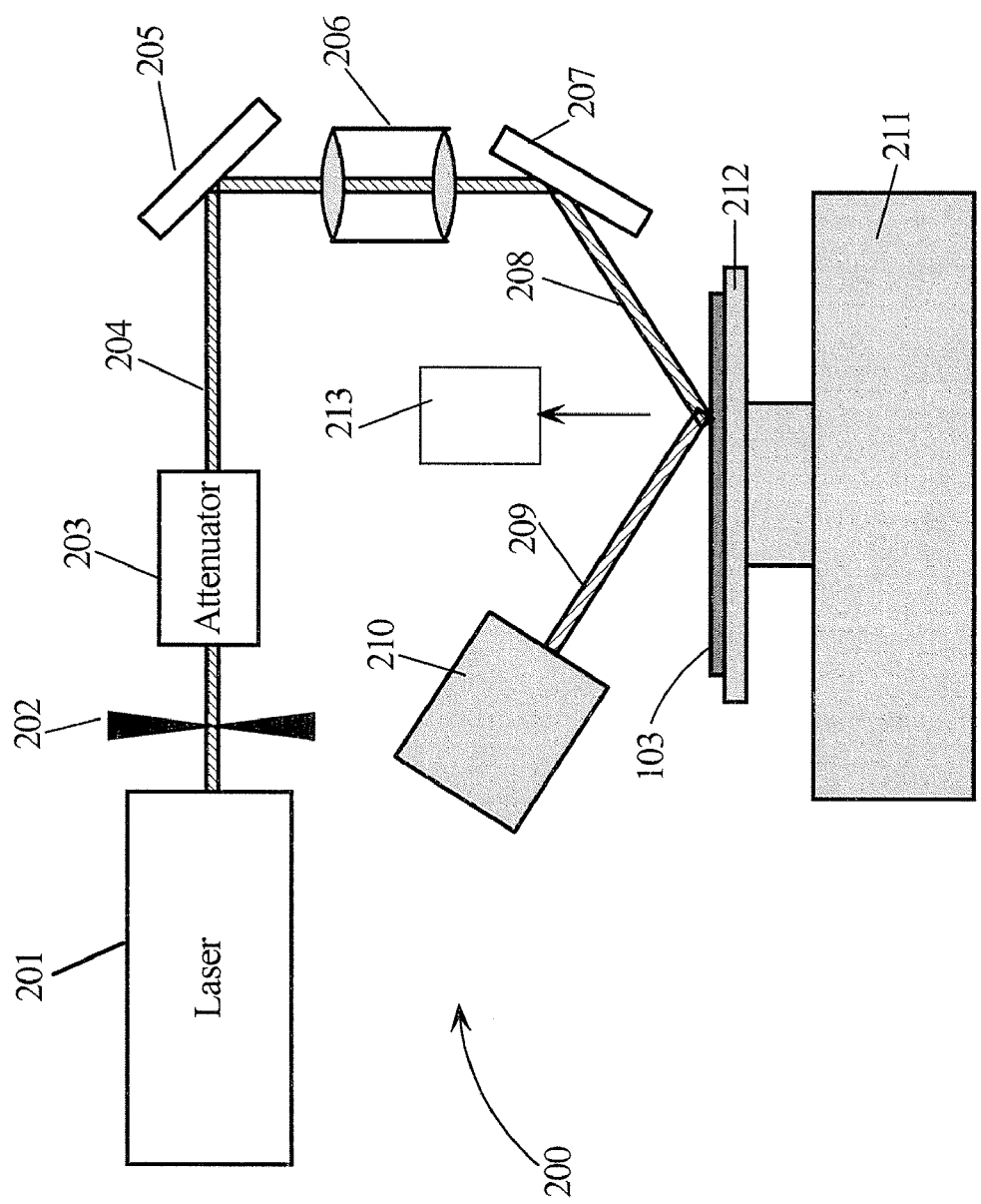
FIG. 2 is a schematic diagram of components in a laser annealing device suitable for use in embodiments of the present invention.

FIG. 2 illustrates elements of a laser anneal tool 200. Laser 201 is the source of laser beam 204. Aperture 202 is used to shape the laser beam 204 and attenuator 203 serves to modulate its amplitude. Mirror 205 is used to re-direct laser beam 104 through lens system 206 which further focuses beam 204 into beam 208. Mirror 207 re-directs laser beam 204 to laser beam 208 that impinges on exemplary substrate 103 at an incident angle. Laser beam 209 is a reflected portion of laser beam 208 that is used to measure the laser beam power in power meter 210. Pyrometer 213 is used to measure the surface temperature of the substrate 103. Substrate or wafer 103 is scanned by laser beam 208 by moving table 212 with scanner 211.

Figure 3:
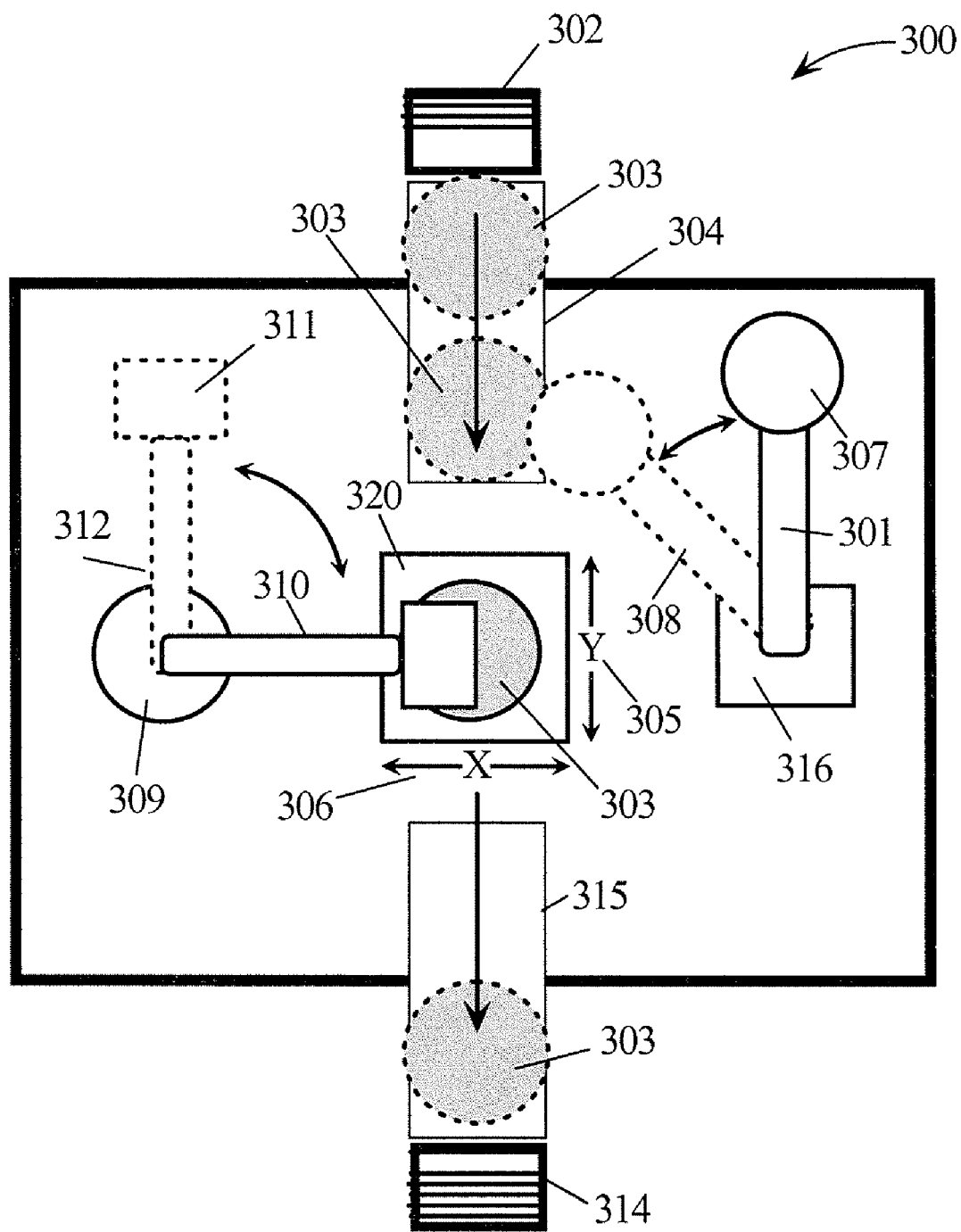
FIG. 3 is a schematic diagram of a single tool for implantation and laser annealing according to embodiments of the present invention.

FIG. 3 illustrates a combination tool 300 according to embodiments of the present invention. Combination tool 300 integrates elements of an ion implantation tool (e.g., 100) with elements of a laser anneal tool (e.g., 200). An exemplary loading station has a cartridge 302 of wafers (e.g., 303) to be processed. A shuttle 304 is used to position a wafer (e.g., 303) for loading onto a scanner 320 that is used to position wafer 303 under either head 311 or 307 in the X 306 and Y 305 directions. Heads 307 and 311 may contain either elements of a laser anneal device or elements of an ion implantation device. In this embodiment, tool element 309 is shown in active position 310 and inactive position 312. Likewise, tool element 316 is shown in inactive position 301 and in transition position 308 to its active position over scanner 320. The common scanner 320 is used to scan exemplary wafer 303 under the ion implantation head or the laser anneal head. Once wafer 303 has been implanted and annealed, it is placed on shuttle 315 that moves wafer 303 to exit cartridge 314.

Figure 4:
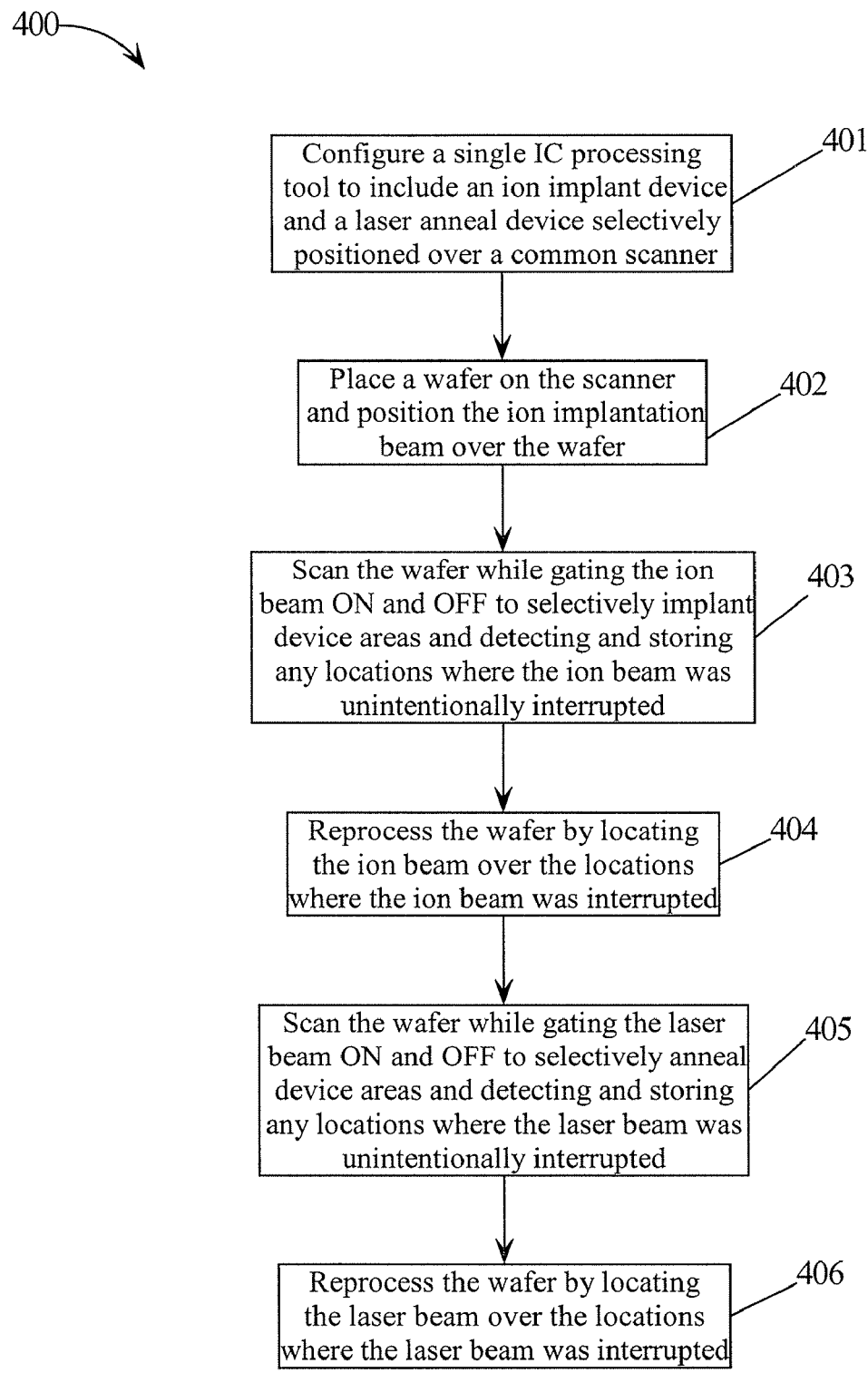
FIG. 4 is a flow diagram of method steps in embodiments of the present invention.

FIG. 4 is a flow diagram 400 illustrating method steps used in embodiments of the present invention. In step 401, an single IC processing tool is configured to include an ion implant device and a laser anneal device that may be selectively positioned over a common scanner. In step 402, a wafer is placed on the scanner and the ion implantation beam is positioned over the wafer. In step 403, the wafer is scanned while the ion beam is gated ON and OFF in response to device data describing device ion implantation levels and locations. In step 403, locations of any unintentional ion beam interruptions are detected and stored. In step 404, the wafer is reprocessed by locating the ion beam over the areas of unintentional ion beam interruption and gating the ion beam ON and OFF to correct any implantation defects. In step 405, the wafer is scanned while the laser beam is gated ON and OFF in response to device data describing device anneal levels and locations. In step 405, locations of any unintentional laser beam interruptions are detected and stored. In step 406, the wafer is reprocessed by locating the laser beam over the areas of unintentional laser beam interruption and gating the beam ON and OFF to correct any anneal defects.

Although the present invention and its advantages have been described in detail, it should be understood that various changes, substitutions and alterations can be made herein without departing from the spirit and scope of the invention as defined by the appended claims.

What is claimed is:

1. A method for integrated circuit (IC) processing in a single integrated ion implantation and laser anneal tool comprising the step of:
    processing a semiconductor wafer in the single tool system by first scanning the semiconductor wafer under the ion implantation tool while gating an ion beam ON and OFF to selectively modify device areas on the semiconductor wafer; and
    processing the wafer in the single tool system by secondly scanning the semiconductor wafer under the laser anneal tool while gating a laser beam ON and OFF to selectively anneal device areas on the semiconductor wafer.

2. The method of claim 1 further comprising detecting and storing locations on the semiconductor wafer of either unintentional ion beam or laser beam interruption.

3. The method of claim 2 further comprising the steps of:
    rescanning to the locations on the semiconductor wafer of either unintentional ion beam or laser beam interruption; and
    reprocessing areas on the semiconductor wafer of unintentional beam interruption, by a selectively gating ON and OFF either the ion beam or the laser beam as applicable.

4. The method of claim 1, wherein no photoresist layer is applied to the semiconductor wafer before a step of ion implantation or a step of laser annealing.

* * * * *